United States Patent
Tokuhiro

(10) Patent No.: US 7,298,192 B2
(45) Date of Patent: *Nov. 20, 2007

(54) DIGITAL DLL DEVICE, DIGITAL DLL CONTROL METHOD, AND DIGITAL DLL CONTROL PROGRAM

(75) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/510,721

(22) Filed: Aug. 28, 2006

(65) Prior Publication Data

US 2006/0290395 A1    Dec. 28, 2006

Related U.S. Application Data

(62) Division of application No. 10/921,216, filed on Aug. 19, 2004, now Pat. No. 7,116,146.

(30) Foreign Application Priority Data

Mar. 29, 2004    (JP)    ............................. 2004-094364

(51) Int. Cl.
*H03L 7/06*    (2006.01)
(52) U.S. Cl. ..................... 327/158; 327/159; 327/161; 327/270
(58) Field of Classification Search ..................... None
See application file for complete search history.

(56) References Cited

U.S. PATENT DOCUMENTS

| | | |
|---|---|---|
| 5,801,559 A | 9/1998 | Sawai et al. |
| 5,939,913 A | 8/1999 | Tomita |
| 6,346,837 B1 | 2/2002 | Shibayama |
| 6,373,307 B1 | 4/2002 | Takai |
| 6,441,657 B1 | 8/2002 | Saeki |
| 6,492,851 B2 | 12/2002 | Watarai |
| 6,573,776 B2 | 6/2003 | Miyamoto |
| 7,116,146 B2 * | 10/2006 | Tokuhiro ..................... 327/158 |

FOREIGN PATENT DOCUMENTS

| | | |
|---|---|---|
| JP | 11-86545 | 3/1999 |
| JP | 11-88153 | 3/1999 |
| JP | 2001-285266 | 10/2001 |
| JP | 2003-133948 | 5/2003 |

* cited by examiner

*Primary Examiner*—Kenneth B. Wells
*Assistant Examiner*—An T. Luu
(74) *Attorney, Agent, or Firm*—Arent Fox LLP

(57) ABSTRACT

A digital DLL device is provided which can reduce an error with respect to a target delay amount. The device provides a delay to an input clock signal so as to equally divide a clock cycle T thereof into N parts, and includes first variable delay sections and second variable delay sections, each of which is formed of an arbitrary number of unit delay buffers connected in series with one another. A phase comparison section makes a compare between the phase of the input clock signal and the phase of an output signal which is the input signal having been delayed while passing through all the first and second variable delay sections, and outputs a result of the comparison. A delay control section calculates a total number of unit delay buffers S required based on the phase comparison result, sets a quotient Q of S divided by N to be the number of unit delay buffers for each of the first variable delay sections, and allocates a remainder R of S divided by N to the second variable delay sections, respectively.

2 Claims, 4 Drawing Sheets

| TOTAL R OF NUMBERS OF STAGES OF UNIT DELAY BUFFERS OF ALL SECOND VARIABLE DELAY SECTIONS | NUMBER OF STAGES OF UNIT DELAY BUFFER OF EACH SECOND VARIABLE DELAY SECTION | | | |
|---|---|---|---|---|
| | E1 | E2 | E3 | E4 |
| 0 (BINARY NUMBER =00) | 0 | 0 | 0 | 0 |
| 1 (BINARY NUMBER =01) | 1 | 0 | 0 | 0 |
| 2 (BINARY NUMBER =10) | 1 | 0 | 1 | 0 |
| 3 (BINARY NUMBER =11) | 1 | 1 | 1 | 0 |

-- Prior Art --

-- Prior Art --

DIGITAL DLL DEVICE, DIGITAL DLL CONTROL METHOD, AND DIGITAL DLL CONTROL PROGRAM

This is a Divisional of application Ser. No. 10/921,216, filed on Aug. 19, 2004, now U.S. Pat. No. 7,116,146, which is based upon and claims the benefit of priority from the prior Japanese Patent Application No. 2004-094364. The entire contents of these prior applications is hereby incorporated by reference.

BACKGROUND OF THE INVENTION

1. Field of the Invention

The present invention relates to a digital DLL device, a digital DLL control method and a digital DLL control program capable of providing a delay to an input clock signal so as to equally divide the clock cycle thereof.

2. Description of the Related Art

First of all, as an example of a DLL device, reference will be made to a memory interface used for DDR (Double Data Rate) memories, DDR2 memories, or the like. FIG. 5 is a timing chart showing one example of the timing of a DQS (read data strobe) signal and a DQ (read data) signal in the DDR memory interface. The DQS signal has a clock cycle T. The DQS signal and the DQ signal passed from a DDR memory to an ASIC are aligned with each other in phase at points of changes, and the DQ signal changes at an interval of T/2. Accordingly, it is necessary to provide the DQS signal with a delay of T/4 so as to accurately read data of the DQ signal. Thus, a DLL (Delay Locked Loop) device is used to obtain such a delay as to equally divide the arbitrary clock cycle T in an exact manner.

Next, reference will be made to the configuration of a known DLL device. Here, the DLL device will be described which is able to obtain a delay of a multiple of T/N when assuming that the clock cycle is T and the number by which the clock cycle is equally divided is N. By way of example, a DLL device with the number N being 4 as used with the above-mentioned DDR memory interface will be described.

FIG. 6 is a block diagram showing one example of the configuration of such a known DLL device. This DLL device is provided with four serially connected variable delay sections 1a, 1b, 1c, 1d, a phase comparison section 2 and a delay control section 3. The variable delay sections 1a through 1d output a first output clock signal of a T/4 delay, a second output clock signal of a 2T/4 delay, a third output clock signal of a 3T/4 delay, and a forth output clock signal of a 4T/4 delay, respectively.

Now, the operation of this known DLL device will be explained below. Each of the variable delay sections 1a, 1b, 1c, 1d has an amount of delay of about T/4, and is able to adjust their delay amount in accordance with a control signal from the delay control section 3. The phase comparison section 2 compares the phase of an input clock signal supplied from the outside to the first variable delay section 1a and the phase of the fourth output clock signal output from the last variable delay section 1d, and generates a resultant output to the delay control section 3 as phase difference information. The delay control section 3 determines, based on the phase difference information, a delay amount for each of the variable delay sections 1a, 1b, 1c, 1d, and outputs a control signal representative of the delay amount thus determined to all the variable delay sections 1a, 1b, 1c, 1d, so that the delay amounts of the variable delay sections 1a, 1b, 1c, 1d can be adjusted at a time.

In general, there are two types, analog and digital, in DLL devices. In analog DLL devices, the control signal from the delay control section 3 to the variable delay sections 1a, 1b, 1c, 1d is of an analog quantity, and hence the delay amount of each variable delay section can be adjusted steplessly, but they are vulnerable to noise since a subtle or slight change in the control signal results in a corresponding change in the delay amount. On the other hand, in digital DLL devices, the variable delay sections 1a, 1b, 1c, 1d are each formed of a plurality of unit delay buffers connected in series with each other in a variable manner, so that the total amount of delay is controlled by adjusting the number of stages of unit delay buffers actually or effectively connected with each other. Thus, only discrete amounts of delay can be obtained, but the control signal is of a digital quantity and hence highly resistant to noise. Therefore, digital DLL devices are generally used as DLL devices for memory interfaces.

FIG. 7 is a block diagram showing one example of the configuration of such a known digital DLL device. This digital DLL device is provided with four serially connected variable delay sections 11a, 11b, 11c, 11d, a phase comparison section 12 and a delay control section 13. Each of the variable delay sections 11a, 11b, 11c, 11d is comprised of a plurality of unit delay buffers which are connected in series with one another in such a manner that the number of stages of the unit delay buffers to be electrically or effectively connected with one another is changed by a control signal from the delay control section 13. In the variable delay sections 11a, 11b, 11c, 11d of FIG. 7, those unit delay buffers 15 which are electrically or effectively connected with one another are represented by black square boxes, whereas those unit delay buffers 15a which are not electrically or effectively connected with one another are represented by white square boxes.

The phase comparison section 12 outputs either one of +1, 0 and −1 as phase difference information. Specifically, when the phase of a fourth output clock signal from the last variable delay section 11d advances with respect to the phase of an input clock signal supplied to the first variable delay section 11a, the phase difference information is set to +1; when the phase of the input clock signal and the phase of the fourth output clock signal coincide with each other, the phase difference information is set to 0; and when the output phase of the fourth output clock signal lags with respect to the phase of the input clock signal, the phase difference information is set to −1.

The delay control section 13 determines the number of stages of unit delay buffers in each of the variable delay sections 11a, 11b, 11c, 11d in accordance with the phase difference information from the phase comparison section 12, and outputs it to all the variable delay sections 11a, 11b, 11c, 11d as a control signal. Specifically, when the phase difference information is +1, the number of stages of unit delay buffers for each of all the variable delay sections is increased by 1; when the phase difference information is 0, the number of stages of unit delay buffers for each of all the variable delay sections is not changed; when the phase difference information is −1, the number of stages of unit delay buffers for each of all the variable delay sections is decreased by 1.

Here, note that the amount of delay of each unit delay buffer in an actual digital DLL device is about 30-80 ps (pico seconds) in the case of using a 0.13 μm CMOS process for example, though it varies depending upon the power supply voltage and the operating temperature.

Here, note that the following patent documents are known to be relevant to the present invention.

Japanese patent application laid-open No. H11-86545 (pages 4 through 9 and FIG. 1)
Japanese patent application laid-open No. H11-88153
Japanese patent application laid-open No. 2003-133948
Japanese patent application laid-open No. 2001-285266

In the above-mentioned known digital DLL device, however, in order to divide the clock cycle T into equal parts, one and the same control signal is output from the delay control section 13 to all the variable delay sections 11a, 11b, 11c, 11d. In the case of a digital DLL device obtaining a delay of a multiple of T/4 as in the above-mentioned example, four times the delay amount of each unit delay buffer becomes the unit of adjustment of the entire digital DLL device. Let us consider, as a concrete example, the case in which the amount of delay of each unit delay buffer is 75 ps. In this case, a minimum unit for adjustment of the delay amount of the entire digital DLL device becomes 300 ps.

Further, let us assume that the digital DLL device as employed in this case has a data rate of 400 Mbps, i.e., the entire digital DLL device has a target delay amount in the form of a clock cycle T of 5,000 ps. At this time, the target delay amount T will be obtained if the number of 75 ps unit delay buffers used in the entire digital DLL device is 5,000/75=66.7.

However, in actuality, the number of stages of unit delay buffers for the entire digital DLL device has always to be a natural number which can be devided by 4. Accordingly, when a sufficient time has elapsed after the delay control section 13 starts control operation, the number of stages of unit delay buffers for the entire digital DLL device moves between 64 and 68. At this time, the number of stages of the unit delay buffers used for the first output clock signal moves between 64/4=16 and 68/4=17, so the delay amount of the first output clock signal moves between 75 ps×16=1,200 ps and 75 ps×17=1,275 ps. Comparing the delay amount of the first output clock signal with the target delay amount of T/4=1,250 ps, an error becomes 50 ps at the maximum. In addition, the delay amount of the fourth output clock signal moves between 75 ps×64=4,800 ps and 75 ps×68=5,100 ps, and hence an error becomes 200 ps at the maximum.

SUMMARY OF THE INVENTION

In view of the above, the present invention has been made to solve the problems as referred to above, and has for its object to provide a digital DLL device, a digital DLL control method and a digital DLL control program which are capable of reducing an error with respect to a target amount of delay in a final output clock signal.

In order to solve the above problems, in one aspect of the present invention, there is provided a digital DLL device which comprises: a digital DLL device that provides a delay to an input clock signal so as to equally divide a clock cycle T into N parts (N being an integer); N variable delay sections each of which is formed of an arbitrary number of unit delay buffers connected in series with one another; a phase comparison section that makes a compare between the phase of the input clock signal and the phase of an output signal which is the input signal having been delayed while passing through all the variable delay sections, and outputs a result of the comparison; and a delay control section that calculates a total number of unit delay buffers required based on the phase comparison result, and allocates the total number of unit delay buffers thus calculated to the individual variable delay sections, respectively.

In another aspect of the present invention, there is provided a digital DLL device which comprises: a digital DLL device that provides a delay to an input clock signal so as to equally divide a clock cycle T into N parts (N being an integer); N first variable delay sections each of which is formed of an arbitrary number of unit delay buffers connected in series with one another; N second variable delay sections each of which is connected with the last stage of the first variable delay sections, each of the second variable delay sections being formed of an arbitrary number of unit delay buffers connected in series with one another; a phase comparison section that makes a compare between the phase of the input clock signal and the phase of an output signal which is the input signal having been delayed while passing through all the first and second variable delay sections, and outputs a result of the comparison; and a delay control section that calculates a total number of unit delay buffers S required based on the phase comparison result, sets a quotient Q of S divided by N to be the number of unit delay buffers for each of the first variable delay sections, sets a remainder R of S divided by N to be a total number of unit delay buffers for the second variable delay sections, and allocates R to the second variable delay sections, respectively.

Preferably, in the digital DLL device according to the present invention, when N is 2 raised to the M-th power (M being an integer), the delay control section represents S in a binary number, controls the second variable delay sections based on R which is represented by lower-order M bits of S, and controls the first variable delay sections based on Q which is represented by the remaining higher-order bits of S.

In a further aspect of the present invention, there is provided a digital DLL control method for providing a delay to an input clock signal so as to equally divide a clock cycle T into N parts (N being an integer), the method comprising: N variable delay steps each of which is formed of an arbitrary number of unit delay buffers connected in series with one another; a phase comparison step for making a compare between the phase of the input clock signal and the phase of an output signal which is the input signal having been delayed while passing through all the variable delay steps, and outputs a result of the comparison; and a delay control step for calculating a total number of unit delay buffers required based on the phase comparison result, and allocating the total number of unit delay buffers thus calculated to the individual variable delay steps, respectively.

In a still further aspect of the present invention, there is provided a digital DLL control method for providing a delay to an input clock signal so as to equally divide a clock cycle T into N parts (N being an integer), the method comprising: N first variable delay steps each of which is formed of an arbitrary number of unit delay buffers connected in series with one another; N second variable delay steps each of which is connected with the last stage of the first variable delay sections, each of the second variable delay sections being formed of an arbitrary number of unit delay buffers connected in series with one another; a phase comparison step for making a compare between the phase of the input clock signal and the phase of an output signal which is the input signal having been delayed while passing through all the first and second variable delay steps, and outputs a result of the comparison; and a delay control step for calculating a total number of unit delay buffers S required based on the phase comparison result, sets a quotient Q of S divided by N to be the number of unit delay buffers for each of the first variable delay steps, sets a remainder R of S divided by N to be a total number of unit delay buffers for the second variable delay steps, and allocates R to the second variable delay steps, respectively.

In a yet further aspect of the present invention, there is provided a digital DLL control program that makes a computer perform a digital DLL control method for providing a delay to an input clock signal so as to equally divide a clock cycle T into N parts (N being an integer), the digital DLL control program serving to make the computer perform the steps comprising: N variable delay steps each of which is formed of an arbitrary number of unit delay buffers connected in series with one another; a phase comparison step for making a compare between the phase of the input clock signal and the phase of an output signal which is the input signal having been delayed while passing through all the variable delay steps, and outputs a result of the comparison; and a delay control step for calculating a total number of unit delay buffers required based on the phase comparison result, and allocating the total number of unit delay buffers thus calculated to the individual variable delay steps, respectively.

In a further aspect of the present invention, there is provided a digital DLL control program that makes a computer perform a digital DLL control method for providing a delay to an input clock signal so as to equally divide a clock cycle T into N parts (N being an integer), the digital DLL control program serving to make the computer perform the steps comprising: N first variable delay steps each of which is formed of an arbitrary number of unit delay buffers connected in series with one another; N second variable delay steps each of which is connected with the last stage of the first variable delay sections, each of the second variable delay sections being formed of an arbitrary number of unit delay buffers connected in series with one another; a phase comparison step for making a compare between the phase of the input clock signal and the phase of an output signal which is the input signal having been delayed while passing through all the first and second variable delay steps, and outputs a result of the comparison; and a delay control step for calculating a total number of unit delay buffers S required based on the phase comparison result, sets a quotient Q of S divided by N to be the number of unit delay buffers for each of the first variable delay steps, sets a remainder R of S divided by N to be a total number of unit delay buffers for the second variable delay steps, and allocates R to the second variable delay steps, respectively. Here, note that this program can be stored in a computer readable medium, and the computer readable medium includes a portable storage medium such as a CD-ROM, a flexible disk, a DVD disk, a magneto-optical disk, an IC card or the like, or a database that holds therein computer programs, or another computer and its database, or a transmission medium on a communication line.

According to the present invention, it is possible to improve the accuracy of a delay amount in a digital DLL device with a limited increase of its circuit size and by the use of an easy control method.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described in detail while referring to the accompanying drawings. In the embodiments of the present invention, similar to the known one as described above, reference will be made to a digital DLL device which is able to obtain a delay of a multiple of T/N with the assumption that a clock cycle is T and a number by which the clock cycle is equally divided is N. As an example, the following description will be given in the case of N being 4.

Embodiment 1

Figures 1, 2:
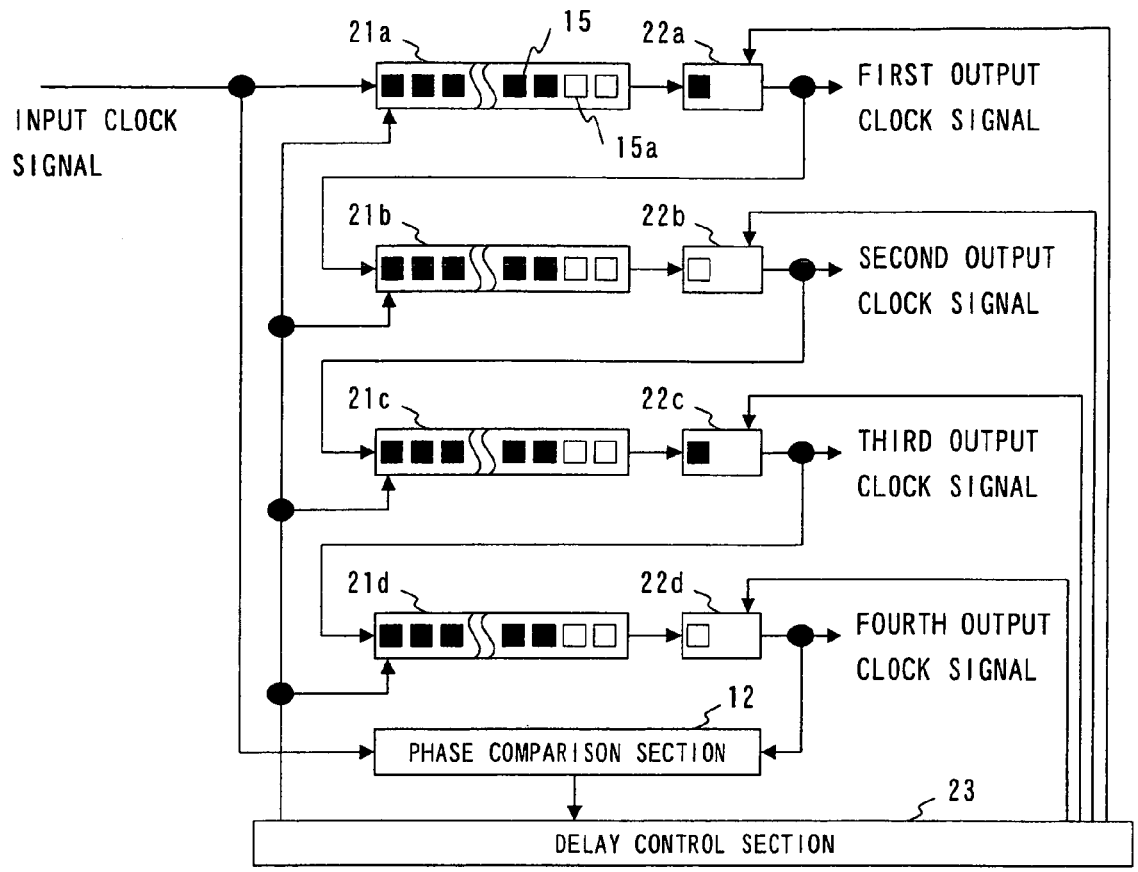
FIG. 1 is a block diagram showing one example of the configuration of a digital DLL device according to a first embodiment of the present invention.
FIG. 2 shows one example of a table for the allocation of the numbers of unit delay buffers to second variable delay sections.
Figure 7:
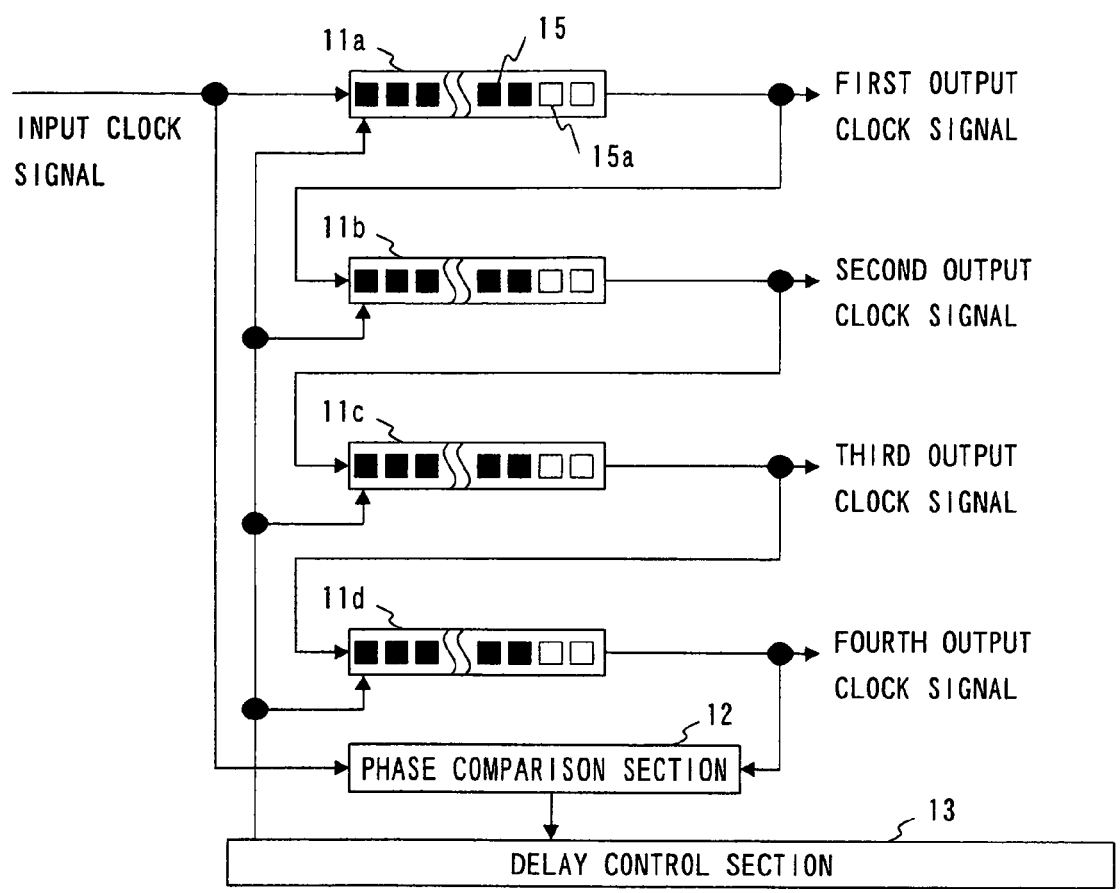
FIG. 7 is a block diagram showing one example of the configuration of a known digital DLL device.

First of all, reference will be made to the construction of a digital DLL device according to a first embodiment of the present invention. FIG. 1 is a block diagram that shows one example of the construction of the digital DLL device according to the first embodiment. In FIG. 1, the same symbols as those in FIG. 7 designate the same or corresponding parts as those shown in FIG. 7, and an explanation thereof is omitted here. In this first embodiment, a delay control section 23 is provided instead of the delay control section 13 in FIG. 7. In addition, a first variable delay section 21a and a second variable delay section 22a are provided instead of the first variable delay section 11a; a first variable delay section 21b and a second variable delay section 22b are provided instead of the first variable delay section 11b; a first variable delay section 21c and a second variable delay section 22c are provided instead of the first variable delay section 11c; and a first variable delay section 21d and a second variable delay section 22d are provided instead of the first variable delay section 11d.

The first variable delay sections 21a, 21b, 21c, 21d and the second variable delay sections 22a, 22b, 22c, 22d are each formed of at least one unit delay buffer, and if there are two or more unit delay buffers for each variable delay section, they are connected in series with each other in such a manner that the number of stages of unit delay buffers electrically connected with one another is changed in accordance with a control signal from the delay control section 23. In the first variable delay sections 21a, 21b, 21c, 21d and the second variable delay sections 22a, 22b, 22c, 22d of FIG. 1, those unit delay buffers 15 which are electrically connected with one another are represented by black square boxes, whereas those which are not electrically connected are represented by white square boxes.

Now, the operation of the digital DLL device according to this embodiment will be described below. The delay control section 23 determines a new total S by adding a phase difference value to a current total S of the number of stages of unit delay buffers for the entire digital DLL device in accordance with the phase difference information from the phase comparison section 12. In other words, when the phase difference information or value is +1, S is increased by 1; when the phase difference information or value is 0, S is not changed; when the phase difference information or value is −1, S is decreased by 1.

Then, the delay control section 23 determines the number of stages Q of unit delay buffers for each first variable delay section and a total R of the numbers of stages of unit delay buffers for the second variable delay sections in accordance with S, wherein Q is a quotient of S divided by N, and R is a remainder of S divided by N, that is, S=Q×N+R.

Then, by referring to a table to be described later, the delay control section 23 allocates the numbers of stages of unit delay buffers to the second variable delay sections 22a, 22b, 22c, 22d, respectively, in such a manner that the total of the numbers of stages of unit delay buffers becomes R. FIG. 2 shows one example of such a table for allocating the numbers of unit delay buffers to the second variable delay sections, respectively. In this example, the numbers of stages E1, E2, E3, E4 of unit delay buffers are allocated to the second variable delay sections 22a, 22b, 22c, 22d, respectively, according to R, that is, the allocation being made as follows: E1+E2+E3+E4=R.

Subsequently, the delay control section 23 outputs the number of stages Q of unit delay buffers to all the first variable delay sections 21a, 21b, 21c, 21d as a control signal, and also outputs the numbers of stages E1, E2, E3, E4 of unit delay buffers to the second variable delay sections 22a, 22b, 22c, 22d, respectively, as control signals. The first variable delay sections 21a, 21b, 21c, 21d and the second variable delay sections 22a, 22b, 22c, 22d act to change their numbers of stages of unit delay buffers, respectively, in accordance with the control signals.

Next, a concrete example of delay amounts will be described below. Here, let us consider the case in which the target delay amount T of the entire digital DLL device is 5,000 ps, and the amount of delay of each unit delay buffer is 75 ps, as in the above-mentioned example of the known digital DLL device.

In this case, the target delay amount T will be obtained if the number of 75 ps unit delay buffers used in the entire digital DLL device is 5,000/75=66.7. In this first embodiment, the number of stages S of unit delay buffers for the entire digital DLL device can be controlled in units of one buffer. As a result, when a sufficient time has elapsed after the delay control section 23 starts controlling, S will move between 66 (16×4+2) and 67 (16×4+3). At this time, a sum of the number of stages Q of unit delay buffers for one of the first variable delay sections and the total R of the numbers of stages of unit delay buffers for the second variable delay sections moves between 18 {i.e., Q=16 and R=2 (E1=1, E2=0, E3=1, E4=0)} and 19 {i.e., Q=16 and R=3 (E1=1, E2=1, E3=1, E4=0)}. However, the number of stages of unit delay buffers used for the first output clock signal becomes stable in such a manner that Q is 16 for the first variable delay section 21a, and E1 is 1 for the second variable delay section 22a. Accordingly, the delay amount of the first output clock signal becomes 75 ps×(16+1)=1,275 ps in a stable manner. Comparing the delay amount of the first output clock signal with the target delay amount of T/4=1, 250 ps, an error is suppressed to 25 ps in a stable manner. In addition, the delay amount of the fourth output clock signal moves between 75 ps×66=4,950 ps and 75 ps×67=5,025 ps, and hence an error becomes 50 ps at the maximum.

Now, reference will be made in detail to the generation of control signals. Particularly, description will be made to the case in which when M is an integer, N is 2 raised to the M-th power. When the value of S is represented by a binary number, the lower-order M bits represent R, and the second variable delay sections 22a, 22b, 22c, 22d are controlled by using this value R while referring to the table. The remaining higher-order bits represent Q, by the use of which the first variable delay sections 21a, 21b, 21c, 21d are controlled.

Figure 3:
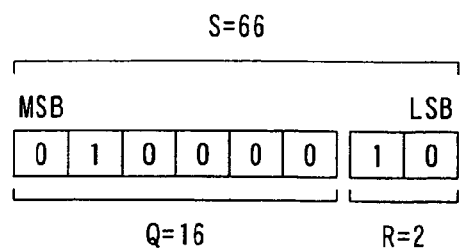
FIG. 3 is a view showing one example of a control signal being generated.

When N=4, M becomes 2, so the lower-order two bits represent R and the remaining higher-order bits represent Q. FIG. 3 is a view that shows one example of generating control signals. FIG. 3 shows a case of S=66, in which R represents 10 in a binary number, and it also represents 2 in a decimal number. In addition, Q represents 10,000 in a binary number, and it also represents 16 in a decimal number. Accordingly, the number of stages Q of unit delay buffers for each of the first variable delay sections 21a, 21b, 21c, 21d becomes 16, and the numbers of stages of unit delay buffers for the second variable delay sections 22a, 22b, 22c, 22d become as follows according to the table of FIG. 2: E1=1, E2=0, E3=1, E4=0.

Embodiment 2

A second embodiment of the present invention is provided with only variable delay sections 31a, 31b, 31c, 31d that can control the number of stages of individual unit buffers, as in the second variable delay sections 22a, 22b, 22c, 22d of the above-mentioned first embodiment.

Figure 4:
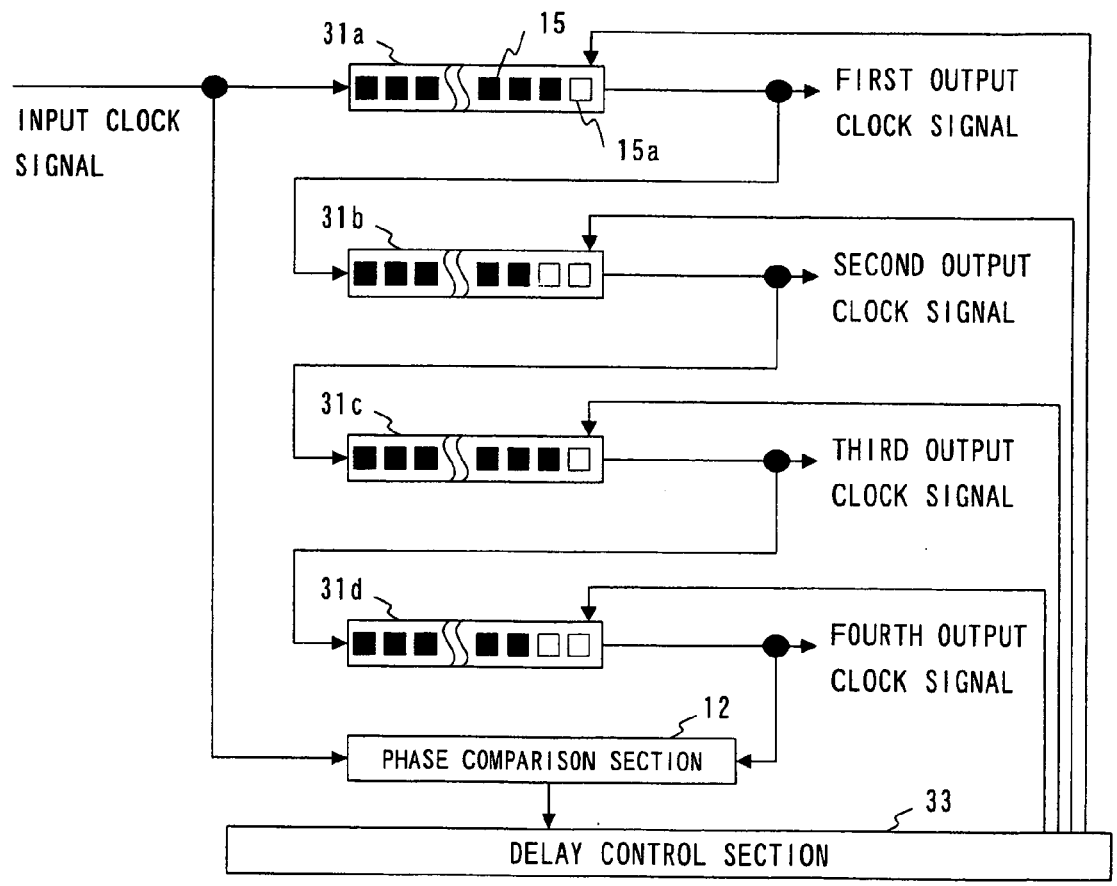
FIG. 4 is a block diagram showing one example of the configuration of a digital DLL device according to a second embodiment of the present invention.
Figure 5:
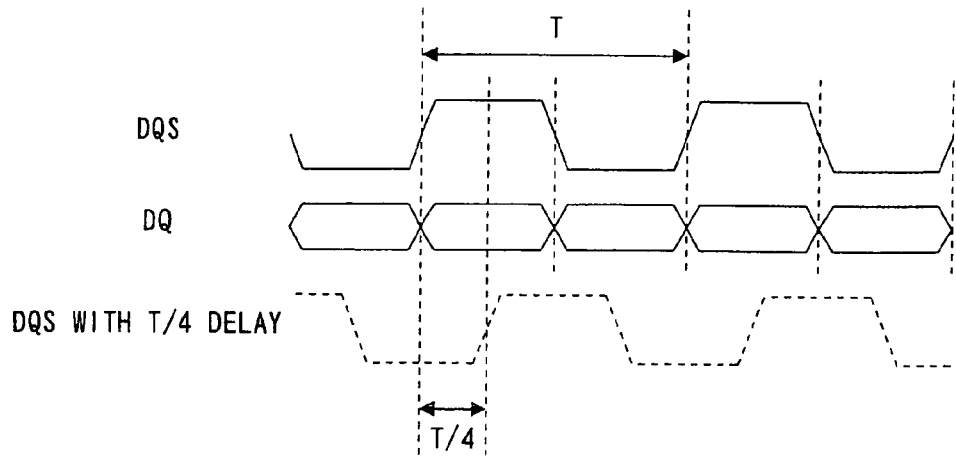
FIG. 5 is a timing chart showing one example of the timing of a DQS signal and a DQ signal in a DDR memory interface.
Figure 6:
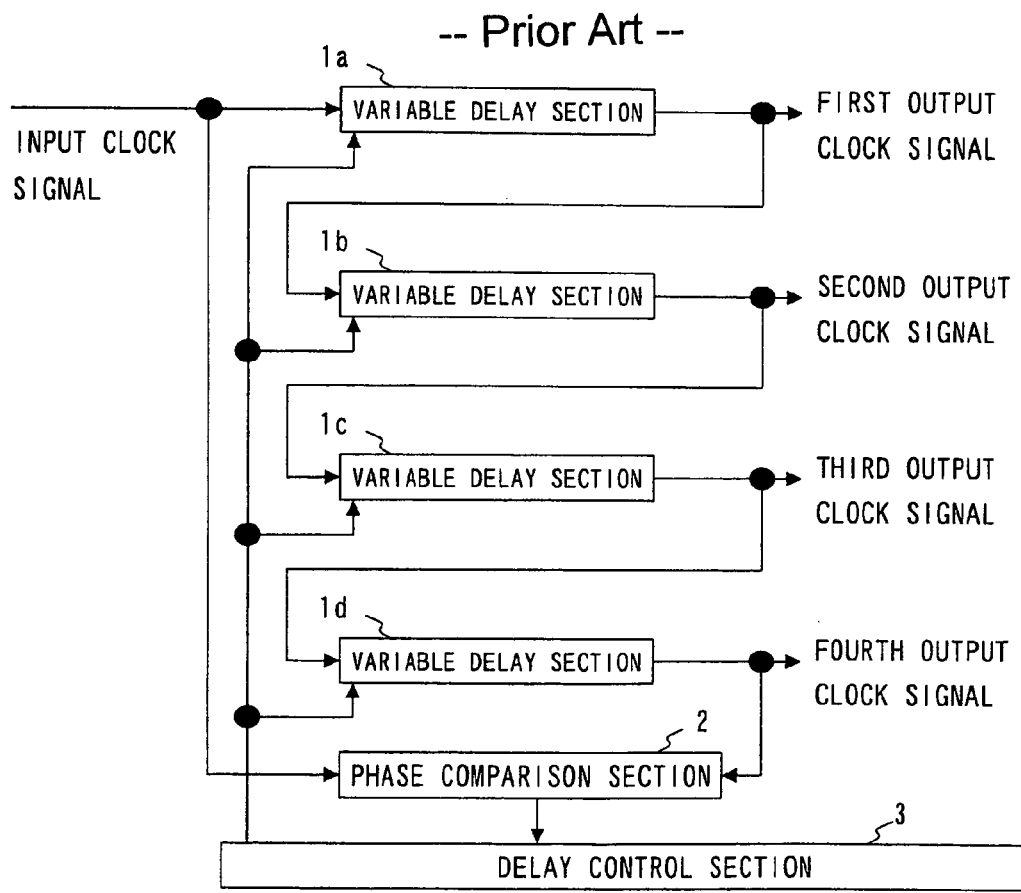
FIG. 6 is a block diagram showing one example of the configuration of a known DLL device.

First, reference will be made to the construction of a digital DLL device according to the second embodiment of the present invention. FIG. 4 is a block diagram that shows one example of the construction of the digital DLL device according to the second embodiment. In FIG. 4, the same symbols as those in FIG. 7 designate the same or corresponding parts as those shown in FIG. 7, and an explanation thereof is omitted here. In this second embodiment, a delay control section 33 is provided instead of the delay control section 13 in FIG. 7. In addition, a variable delay section 31a is provided instead of the first variable delay section 11a; a variable delay section 31b is provided instead of the first variable delay section 11b; a variable delay section 31c is provided instead of the first variable delay section 11c; and a variable delay section 31d is provided instead of the first variable delay section 11d.

The variable delay sections 31a, 31b, 31c, 31d are each comprised of a plurality of unit delay buffers which are connected in series with one another in such a manner that the numbers of stages of the unit delay buffers electrically connected with one another for these variable delay sections are changed in accordance with corresponding control signals, respectively, from the delay control section 33. In the variable delay sections 31a, 31b, 31c, 31d of FIG. 4, those unit delay buffers 15 which are electrically or effectively connected with one another are represented by black square boxes, whereas those unit delay buffers 15a which are not electrically or effectively connected with one another are represented by white square boxes.

Now, the operation of the digital DLL device according to this second embodiment will be described below. The delay control section 33 determines a new total S by adding a phase difference value to a current total S of the number of stages of unit delay buffers for the entire digital DLL device in accordance with phase difference information from the phase comparison section 12.

Then, by referring to a table, the delay control section 33 allocates the numbers of stages F1, F2, F3, F4 of unit delay buffers to the variable delay sections 31a, 31b, 31c, 31d, respectively, according to S in such a manner that the total of the numbers of stages of the unit delay buffers becomes S, that is, F1+F2+F3+F4=S. Thereafter, the delay control section 33 outputs the numbers of stages F1, F2, F3, F4 of unit delay buffers to the variable delay sections 31a, 31b, 31c, 31d, respectively, as control signals. The variable delay sections 31a, 31b, 31c, 31d serve to change the numbers of stages of unit delay buffers electrically connected with one another in accordance with the control signals from the delay control section 33.

Next, a concrete example of delay amounts will be described below. Here, let us consider the case in which the target delay amount T of the entire digital DLL device is 5,000 ps, and the amount of delay of each unit delay buffer is 75 ps, as in the above-mentioned concrete example of the first embodiment. In this second embodiment, the number of stages S of unit delay buffers for the entire digital DLL device can be controlled in units of one buffer. As a result, when a sufficient time has elapsed after the delay control section 33 starts controlling, S will move between 66 and 67. At this time, the number of stages of unit delay buffers used for a first output clock signal from the initial or first variable delay section 31a becomes 17 in a stable manner. Accordingly, the delay amount of the first output clock signal becomes 75 ps×17=1,275 ps in a stable manner, as in the first embodiment. Comparing the delay amount of the first output clock signal with the target delay amount of T/4=1,250 ps, an error is suppressed to 25 ps in a stable manner. In addition, the delay amount of a final or fourth output clock signal moves between 75 ps×66=4,950 ps and 75 ps×67=5,025 ps, and hence an error becomes 50 ps at the maximum.

The present invention as described in detail above can be constructed by hardware alone, or by a combination of a computer and software. In the latter case, a program that makes the computer perform the digital DLL method of the present invention provides a digital DLL control program of the present invention.

While the invention has been described in terms of preferred embodiments, those skilled in the art will recognize that the invention can be practiced with modifications within the spirit and scope of the appended claims.

What is claimed is:

1. A computer-readable storage medium storing a computer-readable program/codes for executing a digital DLL control method for providing a delay to an input clock signal so as to equally divide a clock cycle T into N parts (N being an integer), said digital DLL control method comprising:

N first variable delay steps each of which is formed of an arbitrary number of unit delay buffers connected in series with one another;

N second variable delay steps each of which is connected with the last stage of said first variable delay sections, each of said second variable delay sections being formed of an arbitrary number of unit delay buffers connected in series with one another;

a phase comparison step of making a compare between the phase of said input clock signal and the phase of an output signal which is said input signal having been delayed while passing through all said first and second variable delay steps, and outputting a result of said comparison; and a delay control step of calculating a total number of unit delay buffers S required based on said phase comparison result, setting a quotient Q of S divided by N to be the number of unit delay buffers for each of said first variable delay steps, setting a remainder R of S divided by N to be a total number of unit delay buffers for said second variable delay steps, and allocating R to said second variable delay steps, respectively.

2. A computer-readable storage medium storing a computer-readable program/codes for executing a digital DLL control method for providing a delay to an input clock signal so as to equally divide a clock cycle T into N parts (N being an integer), said digital DLL control method comprising:

N first variable delay steps each of which is formed of an arbitrary number of unit delay buffers connected in series with one another;

N second variable delay steps each of which is connected with the last stage of said first variable delay sections, each of said second variable delay sections being formed of an arbitrary number of unit delay buffers connected in series with one another;

a phase comparison step of making a compare between the phase of said input clock signal and the phase of an output signal which is said input signal having been delayed while passing through all said first and second variable delay steps, and outputting a result of said comparison; and a delay control step of calculating a total number of unit delay buffers S required based on said phase comparison result, setting a quotient Q of S divided by N to be the number of unit delay buffers for each of said first variable delay steps, setting a remainder R of S divided by N to be a total number of unit delay buffers for said second variable delay steps, and allocating R to said second variable delay steps, respectively.

* * * * *